United States Patent [19]

O'Neil, II et al.

[11] Patent Number: 5,739,557
[45] Date of Patent: Apr. 14, 1998

[54] REFRACTORY GATE HETEROSTRUCTURE FIELD EFFECT TRANSISTOR

[75] Inventors: Vernon Patrick O'Neil, II, Chandler; Jonathan K. Abrokwah; Majid M. Hashemi, both of Tempe; Jenn-Hwa Huang, Gilbert; Vijay K. Nair, Mesa; Farideh Nikpourian, Phoenix; Saied Nikoo Tehrani, Scottsdale, all of Ariz.

[73] Assignee: Motorola, Inc., Schaumburg, Ill.

[21] Appl. No.: 384,050

[22] Filed: Feb. 6, 1995

[51] Int. Cl.⁶ .................. H01L 31/0328; H01L 31/0336
[52] U.S. Cl. ..................... 257/192; 257/187; 257/189; 257/194; 257/197; 257/201
[58] Field of Search ............................. 257/187, 189, 257/192, 194, 197, 201

[56] References Cited

U.S. PATENT DOCUMENTS

| | | | |
|---|---|---|---|
| 4,908,325 | 3/1990 | Berenz | 437/40 |
| 5,038,187 | 8/1991 | Zhou | 257/194 |
| 5,142,349 | 8/1992 | Zhu et al. | 357/42 |
| 5,192,698 | 3/1993 | Schuermeyer et al. | 437/40 |
| 5,243,206 | 9/1993 | Zhu et al. | 257/192 |
| 5,399,896 | 3/1995 | Oku | 257/422 |
| 5,408,106 | 4/1995 | Seagayl | 257/190 |
| 5,427,965 | 6/1995 | Teharani et al. | 437/41 |
| 5,466,955 | 11/1995 | Maruhashi et al. | 257/192 |
| 5,473,176 | 12/1995 | Kakumoto | 257/192 |
| 5,482,872 | 1/1996 | Wu | 437/22 |
| 5,528,535 | 6/1996 | Makanishi | 257/194 |

FOREIGN PATENT DOCUMENTS

| | | | |
|---|---|---|---|
| 0371686 | 6/1990 | European Pat. Off. | H01L 17/085 |
| 0631323 | 12/1994 | European Pat. Off. | H01L 27/06 |

OTHER PUBLICATIONS

"Pulse-Doped AlGaAs/InGaAs Pseudomorphic MODFET's", Moll et al., *IEEE Transactions On Electron Devices*, vol. 35, No. 7, Jul. 1988, New York, NY pp. 879–886.

"Highly-Efficient 6.6W 12Ghz HJFET for Power Amplifier", Matsunaga et al., *International Electron Devices Meeting 1994, Technical Digest*, 11–14 Dec. 1994, ISBN 0-7803-2111-1, New York, NY, pp. 895–898.

"A New Fabrication Technology for AlGaAs HEMT LSI's Using InGaAs Nonalloyed Ohmic Contacts", Kuroda et al., *IEEE Transactions On Electron Devices*, vol. 36, No. 10, Oct. 1989, New York, NY, pp. 2196–2203.

*Primary Examiner*—Tom Thomas
*Assistant Examiner*—Fetsum Abraham
*Attorney, Agent, or Firm*—Rennie William Dover

[57] ABSTRACT

A heterostructure field effect transistor and method including at least one passivation layer (20) and at least one etch stop layer (22). Enhancement, depletion and combined devices with both enhancement mode and depletion mode devices are possible with minor process variations. Refractory gate (40) and non-gold refractory ohmic contact (52) metallization combined with other features allows non-liftoff metal patterning.

16 Claims, 7 Drawing Sheets

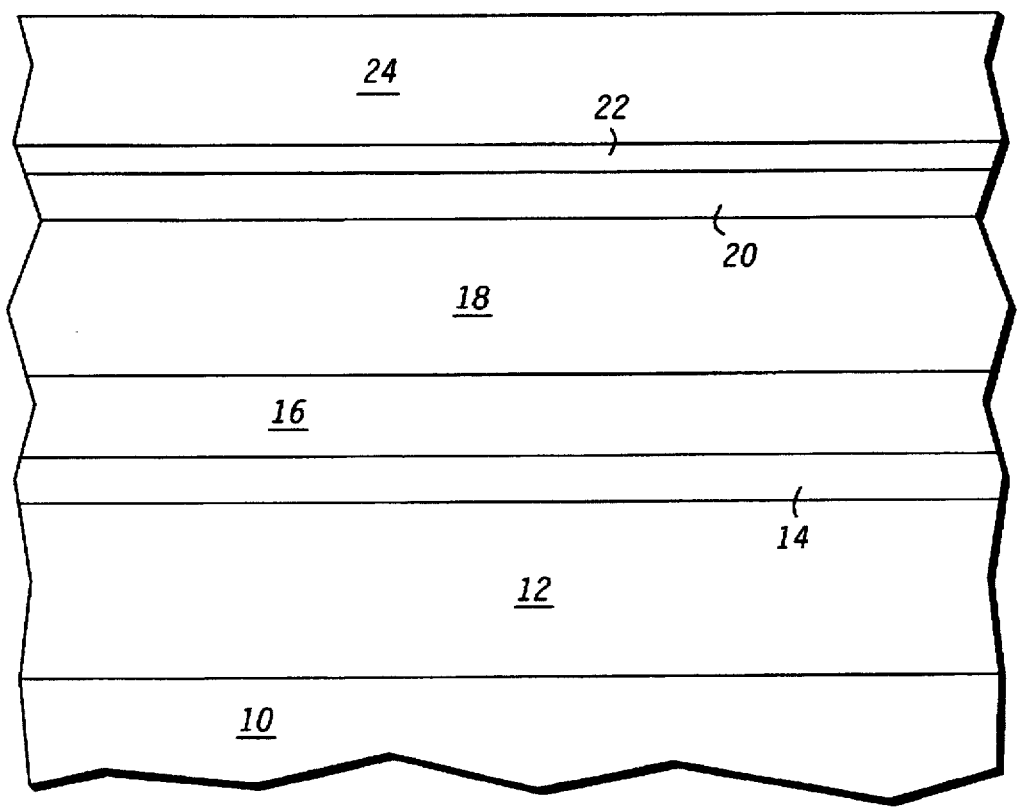
FIG. 1
FIG. 2
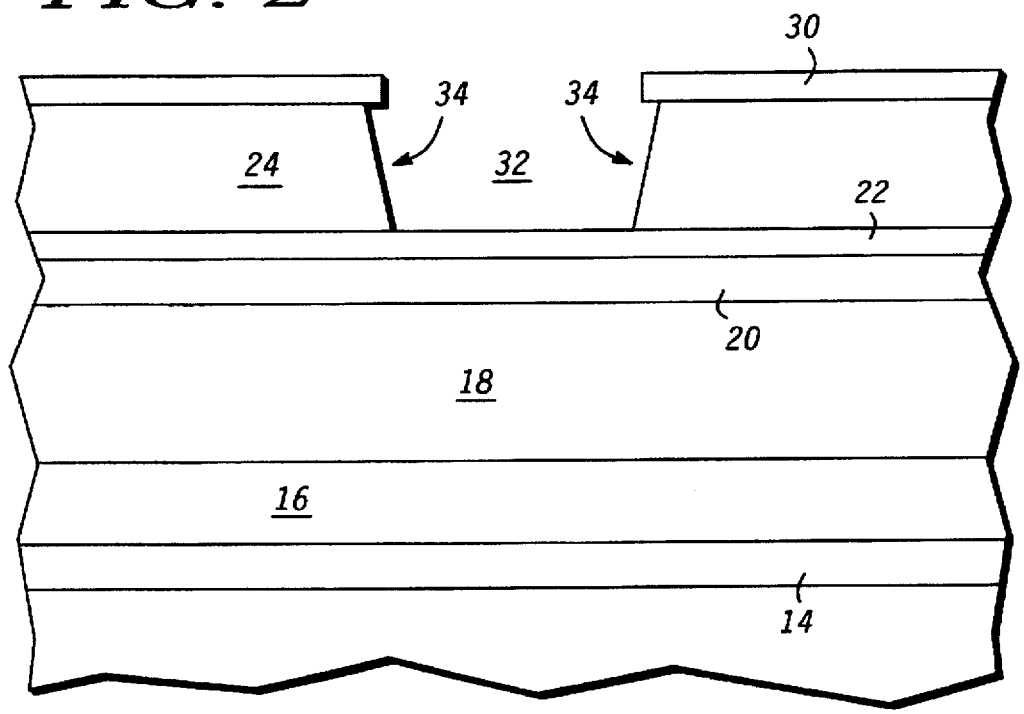

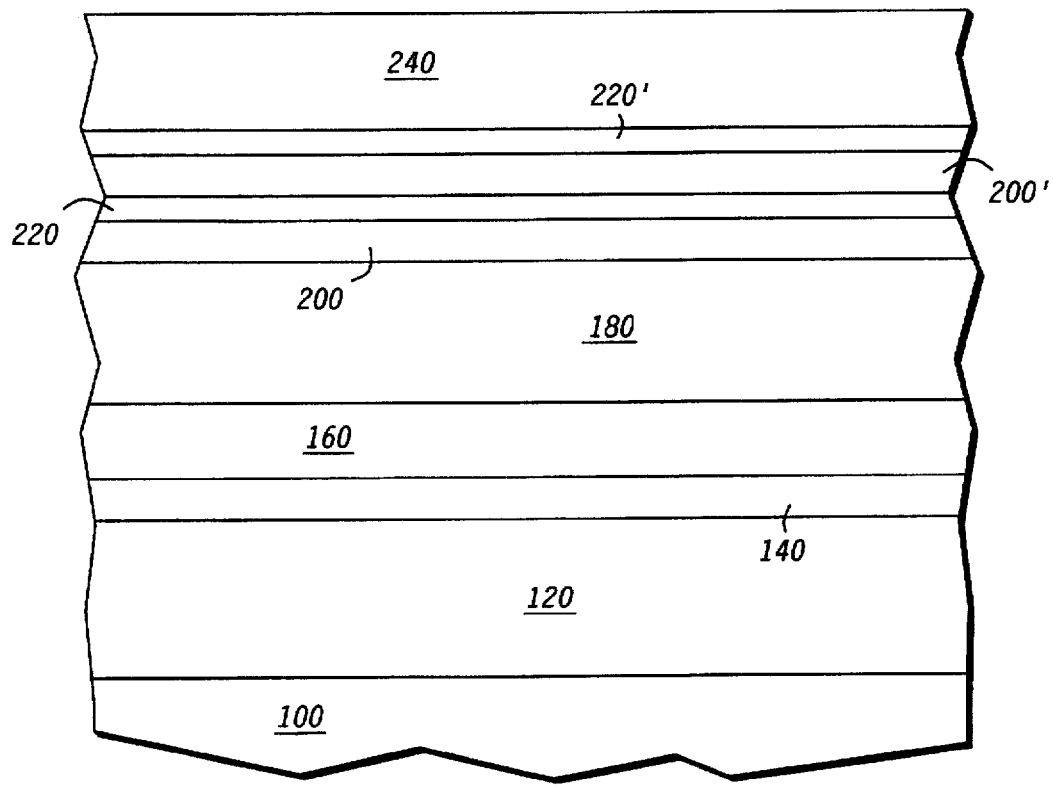
FIG. 9
FIG. 10
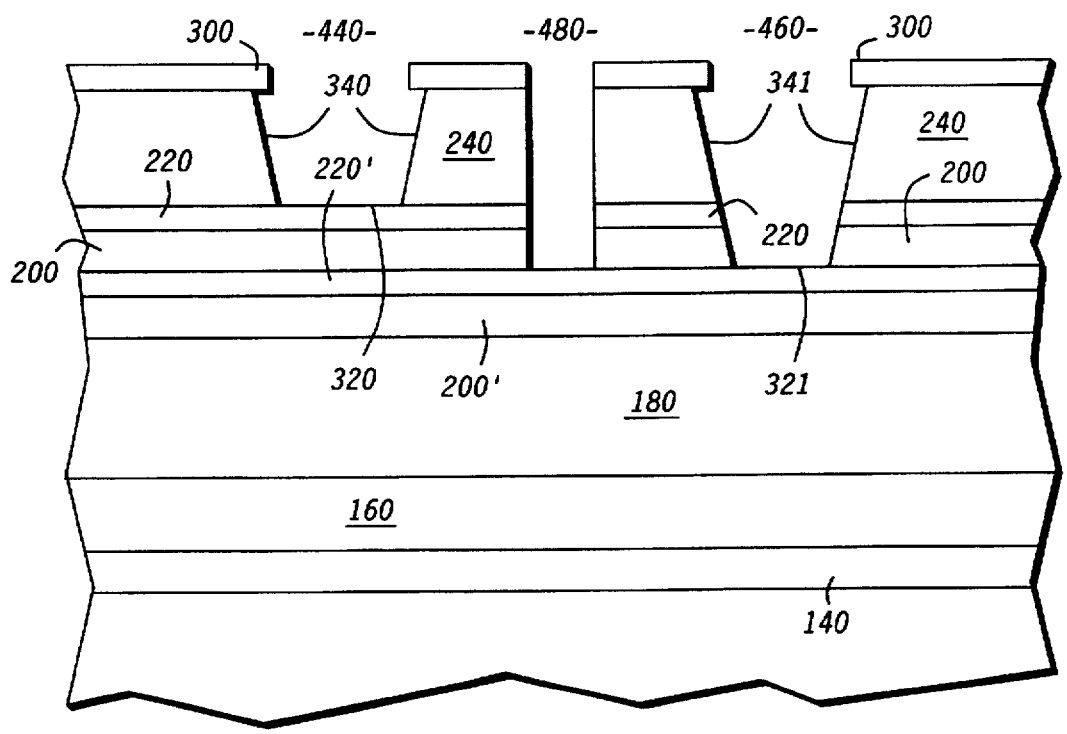

REFRACTORY GATE HETEROSTRUCTURE FIELD EFFECT TRANSISTOR

BACKGROUND OF THE INVENTION

The present invention relates, in general, to heterostructure field effect transistors (HFETs), and more specifically, to HFETs with non-gold ohmic contact metallization.

HFETs have the potential to become widely used in high speed, high efficiency devices and power integrated circuits due to their superior electron transport properties, such as electron drift mobility and saturation velocity. For example HFETs can replace metal semiconductor field effect transistors (MESFETs) in cellular telephones allowing the power supply voltage to be reduced to 3 volts from 6 volts, thus extending battery life and reducing the size and weight of the cellular telephone. Heterostructure FETs (field effect transistors) are also better suited for enhancement mode (normally off) devices due to their larger positive gate voltage swing and output power compared with gallium arsenide (GaAs) MESFETs. However HFETs have not been as widely used as possible due to problems inherent with existing fabrication processes. In particular, these problems include first, processes that use non-refractory ohmic contact metallizations, such as gold-germanium/nickel/gold (AuGe/ Ni/Au), or non-refractory gate contact metallizations, such as titanium/gold (Ti/Au). These non-refractory contact metallizations are inherently unreliable for high power device applications due to metal run-away and/or inter diffusion. A second problem is that often, the surface of the ungated regions (between the gate contact and source/drain contacts) of an HFET is an aluminum gallium arsenide (AlGaAs) layer that is easibly oxidized when exposed to air during subsequent processing. This can be a serious manufacturability problem as oxidation of AlGaAs in these ungated surface regions degrades device performance. Finally, a third problem is that the low mole percent AlGaAs layers, less than 30%, that are required to avoid the deep trapping of the carriers by defects that originate in doped AlGaAs layers with a high mole percent of aluminum are difficult to use with current process technology. This is because these AlGaAs layers, with a low mole percent of aluminum, make highly selective etching of the heavily doped cap layer very difficult and non-reproducible.

Therefore there exists a need for a method of fabricating highly stable and reliable HFETs which is also easily manufacturable and includes low contact resistance non-gold containing refractory ohmic and gate contact metallizations. In addition there exists a need for controllable and reproducible etching of heavily doped layers that is consistent with in situ surface passivation and low mole percent AlGaAs supply layers. And finally there exists a need for a method of fabricating reliable, high performance HFETs that include both enhancement mode and depletion mode devices.

BRIEF DESCRIPTION OF THE DRAWINGS

FIG. 1 illustrates a plurality of layers formed in one embodiment of the present invention;

FIGS. 2–6 show progressive steps in a process of making an HFET in one embodiment of the present invention;

FIG. 9 illustrates a plurality of layers formed in another embodiment of the present invention; and FIGS. 10–13 show progressive steps in the process of making an HFET in the embodiment of FIG. 9.

DETAILED DESCRIPTION OF THE DRAWINGS

Figure 3:
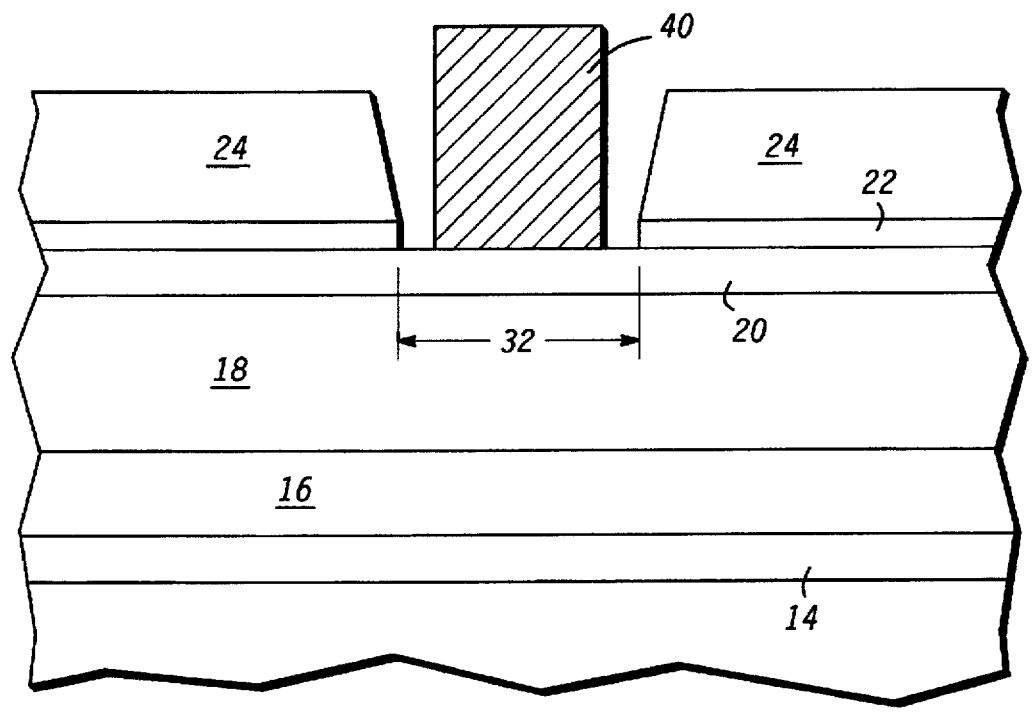

All material layers shown in FIG. 1 and in all subsequent embodiments of the present invention are substantially single crystal epitaxially grown semiconductor layers of group III–V compounds. As is well known in the art, this requires that each semiconductor layer comprise a material that is crystallographically compatible with an underlying layer. These epitaxial layers can be grown by any of the normally accepted epitaxial growth methods, such as metal organic chemical vapor deposition (MOCVD), molecular beam epitaxy (MBE) or atomic layer epitaxy (ALE), or the like and are grown in the order as shown in FIG. 1.

A method of fabricating a first embodiment of a refractory gate heterostructure field effect transistor begins with the structure shown in FIG. 1. The base of the structure is a gallium arsenide (GaAs) semi-insulating wafer substrate 10. A buffer layer 12 is formed overlying substrate 10 and is formed from a GaAs and/or a GaAs/AlAs superlattice. Next a first aluminum gallium arsenide (AlGaAs) supply layer 14, is formed to overlie layer 12, where the thickness of layer 14 is typically about 300 Å plus or minus 100 Å. The mole percent of AlGaAs supply layer 14 will be within the range of 20 to 30% with approximately 24% a preferred value. The first AlGaAs supply layer 14 is an optional layer and its presence is determined by the performance requirements of the ultimate device. Thus a high performance device, such as a power HFET, might require a large number of available carriers in the channel layer. Inclusion of optional first supply layer 14 will result in an increased number of carriers in the channel layer. An indium gallium arsenide (InGaAs) channel layer 16, typically 140 Å plus or minus 60 Å thick, is then formed followed by a second supply layer 18, also formed from AlGaAs 300 Å plus or minus 100 Å thick. Typically both first and second supply layers 14 and 18, respectively, are silicon (Si) doped. Thus, the dopant sheet concentration of first silicon doped AlGaAs supply layer 14 is normally about 1E12 atoms/$cm^2$ and second silicon doped AlGaAs supply layer 18, about 5E12 atoms/$cm^2$, but as one skilled in the art is aware, these dopant concentrations can be varied to suit specific device and or manufacturing requirements. In addition, the dopant can be uniformly dispersed throughout layers 14 and 18, or can be planar doped with Si, as is known in the art. A GaAs passivation layer 20, approximately 50 Å thick, is formed to overlie second supply layer 18, and an Aluminum Arsenide (AlAs) etch stop layer 22, approximately 20 Å thick, is formed to overlie passivation layer 20. Finally a GaAs cap layer 24, heavily doped with Si (typically about 7E18 atoms/$cm^3$), is formed to cover etch stop layer 22. The thickness of heavily doped GaAs cap layer 24 is at least approximately 700 Å thick. While cap layers of other thicknesses will function, it has been found that a heavily doped cap layer of at least approximately 700 Å thick is required for optimum performance. Layers thicker than about 1000 Å add process complexities that outweigh any advantages found and layers thinner than about 1000 Å have increased ohmic resistance. The importance of this minimum thickness will be discussed infra.

As is known to one skilled in the art, the composition of the plurality of semiconductor layers overlying the semi-insulating wafer substrate recited for the first embodiment of the structure shown in FIG. 1 is not the only composition that may be used. Other group III-V compounds can be substituted to perform the functions listed. However, because of the limitation of crystallographic compatibility caused by different lattice constants, substitution of a complete set of materials to comprise another embodiment is more practical than random substitutions. For example, another embodiment of the structure of FIG. 1 would be an indium phosphide (InP) semi-insulating substrate with buffer layer 12 being aluminum indium arsenide (AlInAs), first and second passivation layers 14 and 18, respectively, being AlInAs, channel layer 16 being InGaAs, passivation layer 20 being GaAs, etch stop layer 22 being AlAs or AlInAs and cap layer 24 being InGaAs.

FIGS. 2–6, illustrate the principle steps required to fabricate a depletion mode device in accordance with the present invention. For ease of understanding, the materials of the first embodiment shown in FIG. 1 will be used in explaining the process steps. It will be apparent to those skilled in the art, that other materials, such as those of the other embodiment, can be readily substituted with only such necessary process modifications that are well known and understood. Therefore it is within the scope of the present invention to encompass all such material and process variations.

Referring now to FIG. 2, the structure of FIG. 1 is shown after a hard mask layer 30, for example silicon nitride ($Si_3N_4$), has been deposited and patterned to expose an area of heavily doped GaAs cap layer 24. A portion of heavily doped GaAs cap layer 24 has been etched to form a gate contact area 32 having edges 34. It should be noted that etching heavily doped GaAs cap layer 24 is facilitated by the presence of AlAs etch stop layer 22 and GaAs passivation layer 20. If these two layers were not present, etching heavily doped GaAs cap layer 24 would expose AlGaAs supply layer 18. This would make control of etching heavily doped GaAs cap layer 24 dependent upon the ratio of the etch rate of heavily doped GaAs to the etch rate of AlGaAs. Thus AlGaAs supply layer 18 would necessarily suffer some etch damage during the over-etch portion of the process cycle that is necessary to effect a uniformly etched opening in GaAs cap layer 24. In addition, as those skilled in the art know, the aluminum in AlGaAs is easily oxidized to Aluminum Oxide ($Al_xO_y$ such as $Al_2O_3$) thus requiring the use of "special care" in processing, once exposed. However, as there are always variations inherent in the actual "special care" afforded versus the requirements, differences in device performance, decreased yields and higher costs are the inevitable results. Thus the viability of processes that require "special care" is limited. In this first embodiment, AlAs etch stop layer 22 serves to eliminate the need to carefully tailor an etch process for maximum selectivity between two layers with similar etch characteristics. GaAs passivation layer 20 serves as an oxidation barrier once AlAs etch stop layer 22 has been removed thus removing the "special care" requirement of other process flows, and serves a second important function as discussed below. Therefore inclusion of both GaAs passivation layer 20, and AlAs etch stop layer 22 provides a significant advance over prior art processes.

In FIG. 3, AlAs etch stop layer 22 has been removed from area 32 and a refractory metal, such as titanium-tungsten-nitride (TiWN), is deposited and patterned to form a gate contact 40 overlying a portion of gate contact area 32. Patterning of gate contact 40 can be performed using standard lithographic and etch techniques. Lift-off processes often required in heterostructure processing are not required in this embodiment of the present invention as the presence of GaAs passivation layer 20 prevents oxidation of AlGaAs supply layer 18 during the TiWN etching process. This second important function of GaAs passivation layer 20, is thus another significant advantage of the present invention. Non-liftoff metal patterning is substantially more reliable, higher yielding and statistically more capable. Thus the ability to use non-liftoff metal patterning serves to improve the products ultimate reliability, reduce device variability and to lower its cost.

Figure 4:
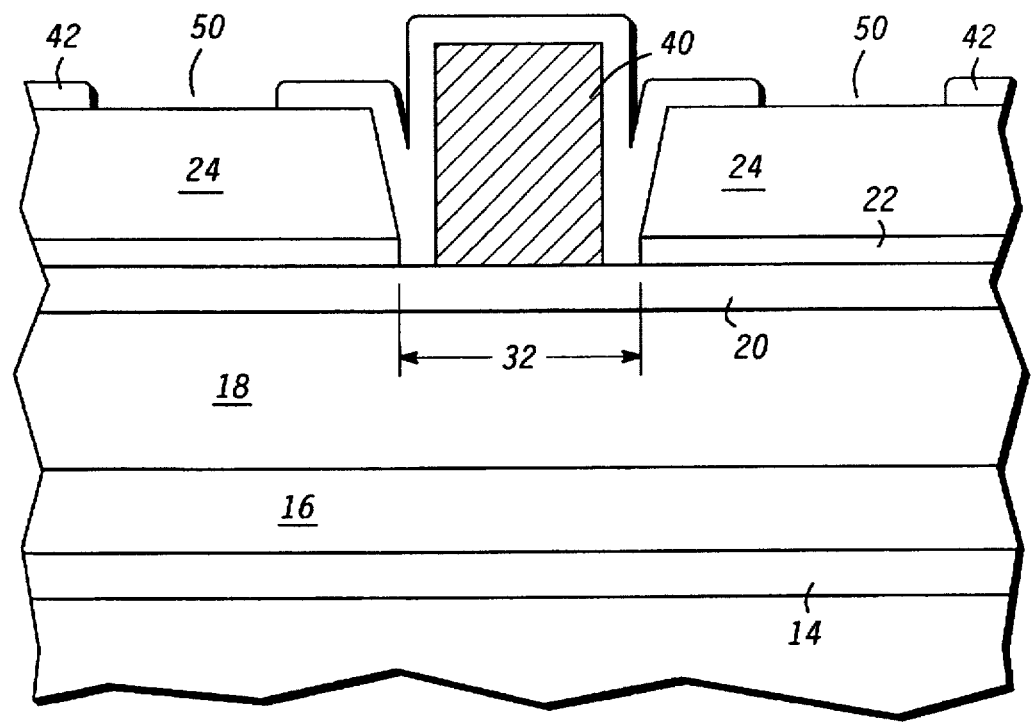

FIG. 4 illustrates that a dielectric layer 42, for example $Si_3N_4$, is deposited to overlie the features shown in FIG. 3. It can be seen that ohmic contact areas 50 are defined in dielectric layer 42. Standard lithographic and etching techniques, well known to those skilled in the art, can be employed.

Figures 5, 6:
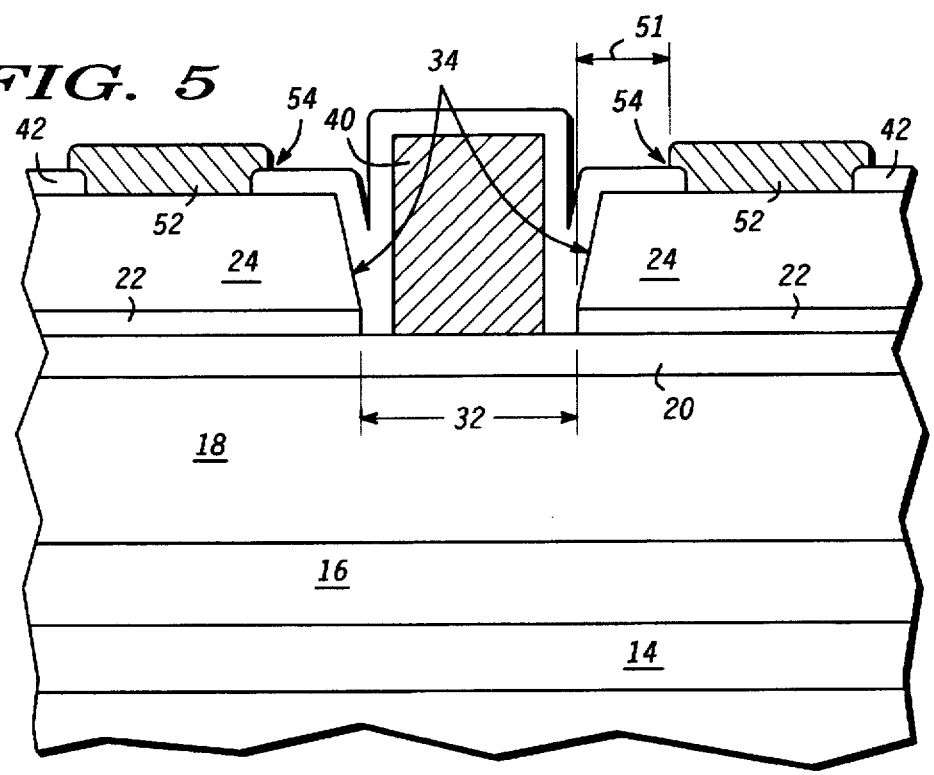

Referring now to FIG. 5, a pair of ohmic contacts 52 having edges 54, are illustrated and are comprised, in this first embodiment, of a non-gold refractory metal, for example nickel-germanium-tungsten (NiGeW). Ohmic contacts 52 are deposited, patterned and etched using any of the standard processing techniques known in the art. After ohmic contacts 52 have been patterned, typically a thermal anneal is performed. In one embodiment, the anneal is done by a rapid thermal anneal (RTA) process that raises the temperature of the structure to approximately 550° C. for between approximately 20 to 60 seconds. However, any other method of annealing ohmic contacts 52 can also be used. The positioning of ohmic contact areas 50 and ohmic contacts 52 is important. In the present invention, an ohmic gap, indicated as 51, is typically at least approximately $2\mu$, and is shown to be measured between ohmic contact edge 54 and adjacent edge 34 of the gate contact area 32. The importance of this spacing will be discussed hereinafter.

Referring now to FIG. 6, it is seen that a thick dielectric layer 60 has been deposited and patterned. Thick dielectric layer 60 consists of silicon dioxide ($SiO_2$), $Si_3N_4$ or some oxynitride material, all of which are well known in the art as dielectric layers. Via openings 62 have been patterned and etched using standard lithographic and etching processes that are tailored to the material that comprises thick dielectric layer 60. This is then followed by the deposition and patterning of interconnect metal 70, for example aluminum or some commonly used aluminum alloy. The patterning of interconnect metal 70 provides for electronic contact to refractory gate heterostructure field effect transistor elements such as ohmic contacts 52 and gate contacts 40. Again the deposition, patterning and etching of interconnect metal 70 is accomplished by standard semiconductor manufacturing processes that have been tailored to this specific application.

Figure 7:
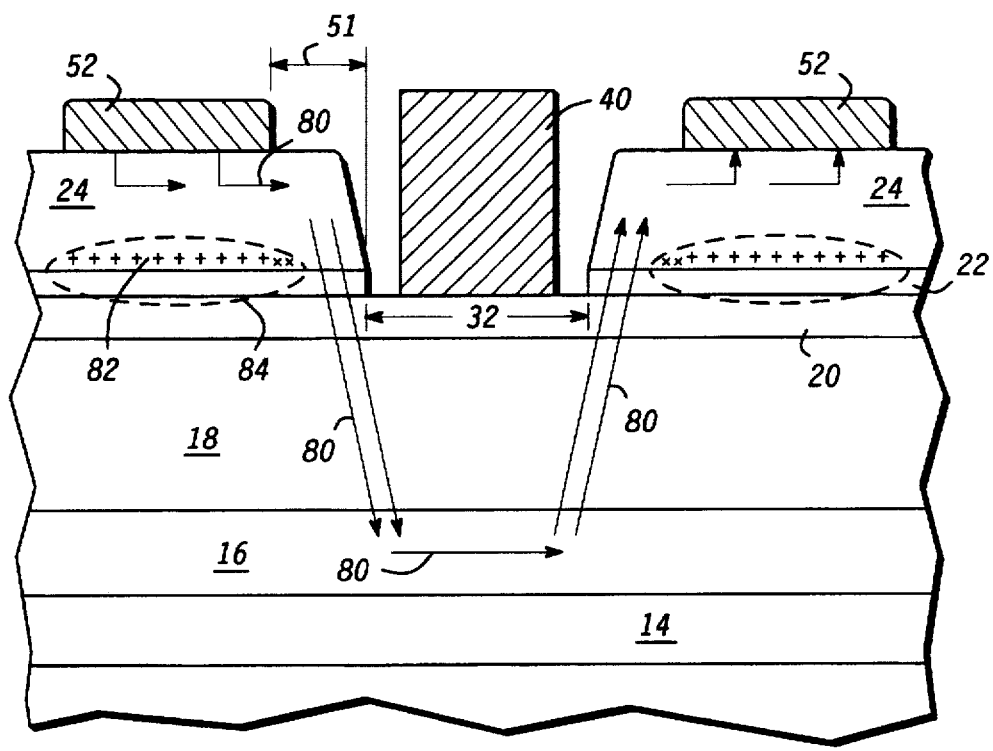
FIG. 7 illustrates defects formed in the HFET of the preferred embodiment.

FIG. 7 depicts an example of a partially manufactured device in the manner of the first embodiment, useful in better understanding the present invention. A defect region 82 is shown accumulated essentially directly beneath ohmic contact 52 at the interface of GaAs cap layer 24 and AlAs etch stop layer 22. This defect region 82 appears to be associated with a non-gold ohmic contact metal, such as NiGeW, as it is not visible when a gold ohmic contact metal, such as NiGeAu is employed. It is believed that defect region 82, is the result of removing the gold from the ohmic contact metal. Gold is known to react with GaAs and form AuGa phases while nickel and germanium react to form a NiGeAs phase. However, when the gold is replaced with a non-reactive element such as tungsten, the gallium will not react with the tungsten and could pile up as precipitates at the heterojunction. It is further believed that defect region 82 is electrically active and that this electrical activity results in the formation of a depletion region 84. As FIG. 7 illustrates, the formation of defect region 82 and associated depletion region 84 may restrict current flow into and out of gate region 32 to paths indicated by arrows 80. Thus, if current flow is restricted, ohmic resistance is increased from an equivalent structure having NiGeAu ohmic metal. However, as shown in FIG. 7, it has been found that by adjusting the thickness of GaAs cap layer 24 to at least a minimum thickness and by maintaining ohmic gap 51 to at least a minimum dimension, ohmic resistances equal to those obtained with gold containing ohmic metals can be achieved with non-gold containing ohmic metals. Thus, the benefits of non-gold, refractory contact metallizations for both the ohmic contact and gate contact areas can be obtained.

Figure 8:
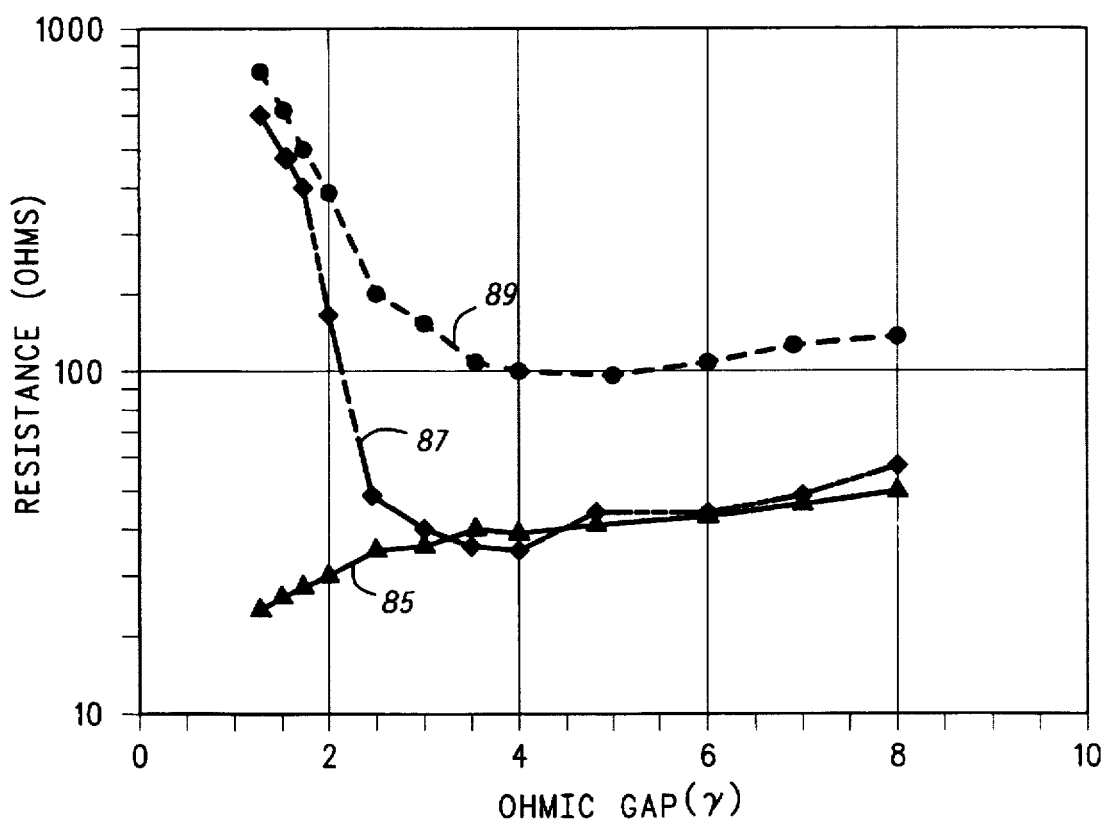
FIG. 8 is a graph showing the relationship between ohmic gap and ohmic resistance for various thicknesses of a cap layer.

As mentioned previously, it has been found that the thickness of GaAs cap layer 24 should be at least approximately 700 Å and that ohmic gap 51 is typically at least 2μ. FIG. 8 is a graph that illustrates the relationship between both the thickness of GaAs cap layer 24 and the dimension of ohmic gap 51 versus ohmic resistance. The y-axis is in ohms and the x-axis is in microns (μ). Curve 89 represents 500 Å GaAs cap layer 24 with NiGeW ohmic contact metal and curve 87 represents 1000 Å GaAs cap layer 24 with NiGeW ohmic contact metal. Curve 85 represents 500 Å GaAs cap layer 24 with NiGeAu ohmic contact metal. Thus, comparing curves 87 and 89, it is apparent that for a NiGeW metallization the ohmic resistance is higher if a thinner GaAs cap layer is used. In addition, lines 87 and 89 also indicate that the ohmic resistance remains approximately unchanged as ohmic gap 51 dimension decreases, until approximately 3.5μ for curve 89 and approximately 2.5μ for curve 87. At ohmic gap 51 dimensions below those values the ohmic resistance begins to increase. On the other hand, the relatively flat curve 85, shows no such relationship between cap thickness and ohmic gap where the ohmic contact metal used contains gold. Therefore, it should be apparent that to take advantage of the improved reliability, and manufacturability of the non-gold NiGeW metallization, the thickness of GaAs cap layer 24 should be at least approximately 700 Å and ohmic gap 51 dimension of at least approximately 2μ.

In another embodiment of the present invention, a second heterostructure electronic device is fabricated from a structure with III–V semiconductor layers similar to that of FIG. 1 is shown in FIG. 9. The base of the structure is a GaAs semi-insulating substrate 100. A buffer layer 120 is formed overlying substrate 100 from either GaAs and/or a GaAs/AlAs superlattice. Next, a first AlGaAs supply layer 140 is formed to overlie buffer layer 120, where the thickness of first supply layer 140 is typically about 300 Å plus or minus 100 Å. The mole percent of first AlGaAs supply layer 140 will be within the range of 20 to 30% with approximately 24% a preferred value. An InGaAs channel layer 160, typically 140 Å plus or minus 60 Å thick, is then formed followed by forming a second AlGaAs supply layer 180, 200 Å plus or minus 100 Å thick. Typically both the first and second supply layers 140 and 180 respectively are Silicon (Si) doped and of the same stoichiometry. The dopant sheet concentration of first supply layer 140 is normally about 1E12 atoms/cm² and of second supply layer 180 about 5E12 atoms/cm², but as one skilled in the art is aware, these dopant concentrations can vary. A first GaAs passivation layer 200, approximately 50 Å thick, is formed to overlie second supply layer 180, and a first AlAs etch stop layer 220, approximately 20 Å thick, is formed to overlie first passivation layer 200. A second GaAs passivation layer 201, also approximately 50 Å thick, is formed to overlie first etch stop layer 220 and a second AlAs etch stop layer 221, also approximately 20 Å thick, is formed to overlie second passivation layer 201. Finally, a GaAs or InGaAs cap layer 240, heavily N+ doped with Si (typically about 5E18 atoms/cm³), is formed to cover second etch stop layer 221. The thickness of GaAs cap layer 24 is at least approximately 700 Å and typically within the range of approximately 700 to 1000 Å.

As seen in the discussion of the structure of FIG. 1, it is known to one skilled in the art that the composition of the layers recited in FIG. 9 are not the only compositions that can be used. For example, another embodiment of the structure of FIG. 9 would be an InP semi-insulating substrate, with buffer layer 120 being AlInAs, first and second supply layers 140 and 180, respectively, being AlInAs, channel layer 160 being InGaAs, first and second passivation layers 200 and 201, respectively being GaAs, first and second etch stop layers 220 and 221, respectively being AlAs or AlInAs, and cap layer 240 being InGaAs.

FIGS. 10–13 illustrate the principal steps required to fabricate another embodiment of the present invention having both at least one depletion mode device and at least one enhancement mode device. Referring now to FIG. 10, the structure of FIG. 9 is shown after a hard mask layer 300, for example $Si_3N_4$, has been deposited and patterned to expose areas of heavily doped GaAs cap layer 240 which is then etched to form first and second gate contact areas 320 and 321 with first and second edges 340 and 341 as well as isolation region 480. It should be noted that first gate contact area 320 is a portion of a depletion mode device region 440 and that second gate contact area 321 is a portion of an enhancement mode device region 460. In addition, it should be apparent that the etching required to expose first and second gate contact areas 320 and 321 as well as opening isolation region 480 is done in two principle steps. In the first step, all three regions 440, 460 and 480 are etched to a first stage which exposes AlAs etch stop layer 220. In the second step, region 440 is protected with a masking material (not shown) and additional etching is performed to expose AlAs etch stop layer 221 in regions 460 and 480. It should be noted that the presence of AlAs etch stop layers 220 and 221 facilitate this processing.

Figure 11:
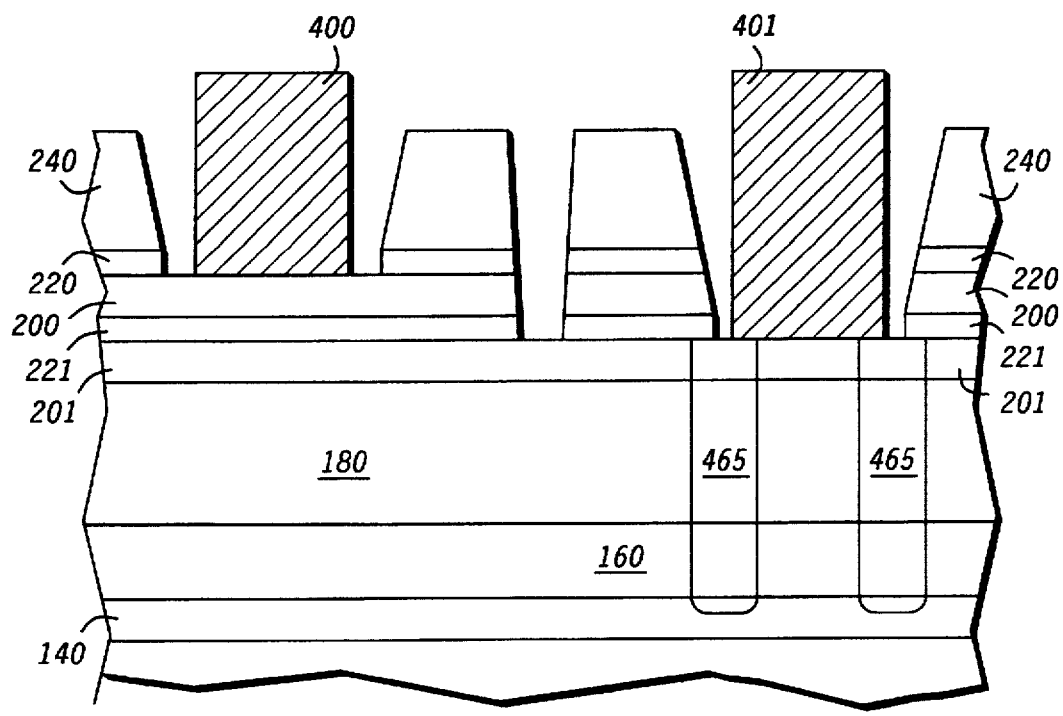

In FIG. 11, AlAs etch stop layers 220 and 221 have been removed from gate contact areas 320 and 321. Dielectric layer 300 is removed, a refractory metal layer, such as TiWN, deposited and patterned to form first and second gate contacts 400 and 401 covering portions of first and second gate contact areas 320 and 321 respectively and N⁺ implant regions 465 have been formed. The deposition and patterning of the refractory gate metal to form first and second gate contacts 400 and 401, is performed using standard deposition, lithographic and etch techniques, as discussed previously with respect to the first embodiment. After forming first and second gate contacts 400 and 401, a thin implant screen layer, such as 500 Å $Si_3N_4$, is deposited and an implant mask, for example photoresist, is then deposited and patterned to expose only enhancement mode device region 460 (both not shown). N⁺ implant regions 465 are formed, typically with a silicon implant, using gate contact 401 to act as an additional masking element thus insuring proper positioning of the dopant as shown. The silicon implant is performed at an energy of between approximately 50 to 100 Kev to obtain a dopant sheet concentration of approximately 6E13 atoms/cm², although other dopants and dopant concentrations can be used, as is well known to those skilled in the art. After removal of the implant mask, N⁺ implant regions 465 are annealed to activate the dopant. Typically an RTA anneal is employed with the temperature raised to at least approximately 800° C. for between approximately 30 to 60 seconds, although any other anneal technique yielding the desired dopant activation can be used. As illustrated in FIG. 11, after the anneal step, typically each implant region 465 will overlap second gate contact area 321 by at least approximately 0.5μ. The implanted dopant provides a low access resistance for the enhancement mode FET.

Figure 12:
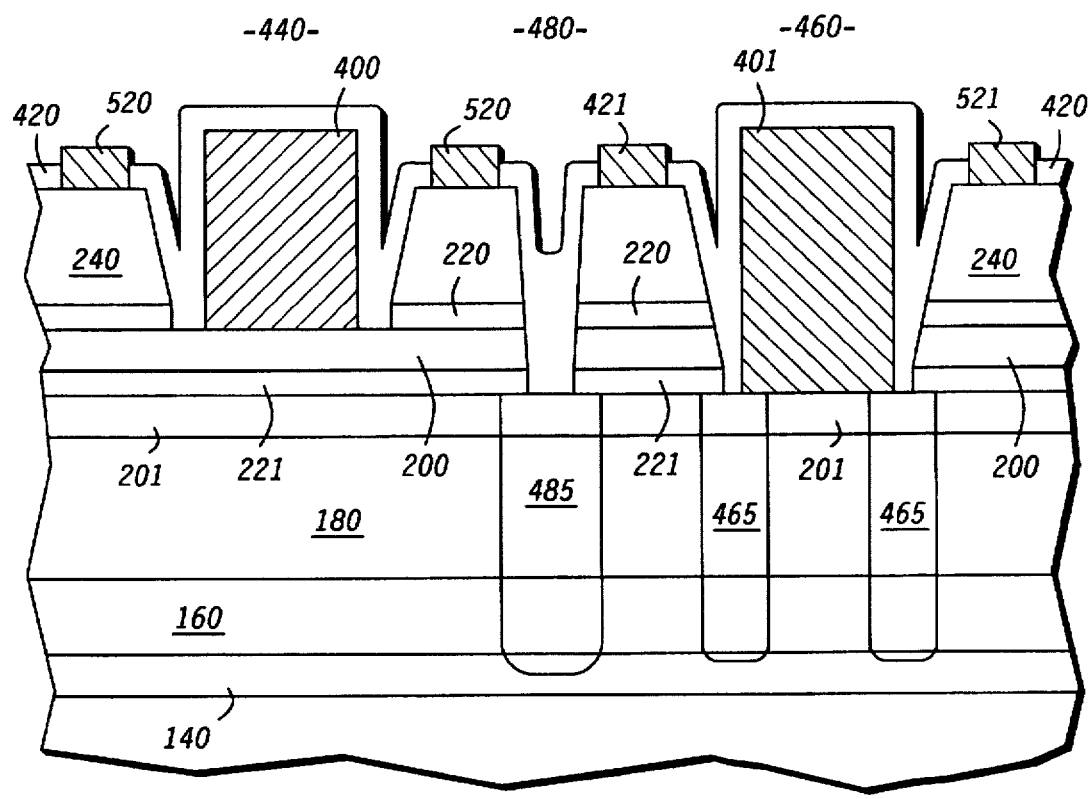

FIG. 12 illustrates the addition of isolation implant region 485, dielectric layer 420 and first and second ohmic contacts 520 and 521 to the structure of FIG. 11. An implant mask is deposited (not shown) and patterned to allow the formation of isolation implant region 485 in isolation region 480. As was the case with the N+ implant discussed supra, the nature of the dopant, the concentration and the implant energy employed for forming isolation implant region 485 are all elements that one skilled in the art would expect to adjust to meet specific requirements. Typically oxygen ($O_2$) is used as an isolation dopant, although boron (B) or atomic hydrogen (H) could also be used. As uniformity of dopant concentration is important to achieve good electrical isolation, the implant process employed is typically a series of two or three implants performed at different energy levels. Thus, a uniform $O_2$ dopant sheet concentration, throughout isolation implant region 485, of approximately 5E12 atoms/cm$^2$ can be obtained by first performing three implants, one each at 90, 180 and 960 Kev. At this point, the implant mask is removed and dielectric layer 420 is deposited. Dielectric layer 420 can be of any suitable dielectric material, for example $SiO_2$. After formation of dielectric layer 420, first and second contact areas 500 and 501 are created using standard lithographic and etch techniques as are appropriate. Once first and second ohmic contact areas 500 and 501 are created, a non-gold ohmic metal, for example NiGeW, is deposited to overlie dielectric layer 420 and first and second contact areas 500 and 501. Non-gold ohmic metal is then patterned to form first and second ohmic contacts 520 and 521. After first and second ohmic contacts 520 and 521 are formed, a thermal anneal is typically performed. In this embodiment of the present invention, the anneal of isolation implant region 485 and first and second ohmic contacts 520 and 521 is performed using an RTA process that raises the temperature of the structure to approximately 550° C. for between approximately 20 to 60 seconds. While typically this anneal step is used to activate the dopant in isolation implant region 485 at the same time first and second ohmic contacts 520 and 521 are annealed, a separate anneal immediately after the formation of isolation implant region 485 can also be performed. Also, as in the first embodiment, the positioning of first and second ohmic contact areas 500 and 501 and first and second ohmic contacts 520 and 521 are important to maintain an ohmic gap (illustrated as gap 51 in FIG. 7) that is typically at least approximately 2μ, as well as to insure that N+ implant area 465 does not overlap either second ohmic contact 521.

Figure 13:
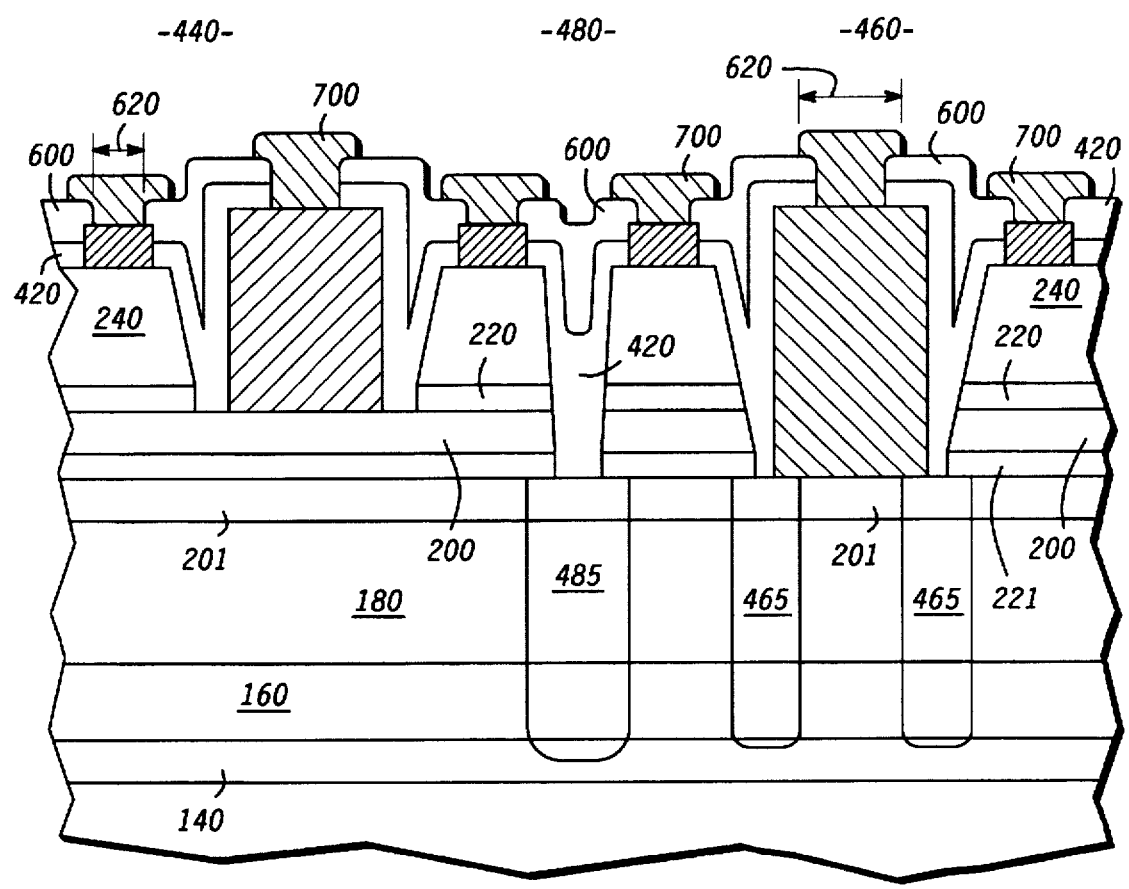

Referring now to FIG. 13, a thick dielectric layer 600 has been deposited to overlie dielectric layer 420 and first and second ohmic contacts 520 and 521. Thick dielectric layer 600 can consist of $SiO_2$, $Si_3N_4$ or some oxynitride material, all of which are well known in the art as dielectric layers. Via openings 620 have been patterned and etched using standard lithographic and etching processes that are tailored to the material that comprises thick dielectric layer 600. As illustrated in FIG. 13, first and second ohmic contacts 520 and 521, as well as first and second gate contacts 400 and 401 each have a via opening 620 formed thereon. Then interconnect metal 700, for example aluminum or some commonly used aluminum alloy is formed and patterned. Again the deposition, patterning and etching of interconnect metal 700 is accomplished by standard semiconductor manufacturing processes that have been tailored to this specific application. It should be noted that typically the pattern of interconnect metal 700 provides a backbone of electrical contact to the heterostructure field effect transistor elements that require such electrical contact, for example first and second ohmic contacts 520 and 521 and first and second gate contacts 400 and 401.

By now it should be appreciated from the description and figures provided that a novel method of making high performance, highly reliable heterostructure field effect transistors has been provided. The heterostructure electronic device structures in accordance with the embodiments of the present invention additionally offer manufacturability advantages not hitherto available. Furthermore, the description and figures provided make obvious that depletion mode, enhancement mode or combined depletion and enhancement mode devices can be made with what is essentially one uniform process. This unity of processing thus greatly simplifies the manufacturing process and provides for lower costs that are associated with higher yields and that are demanded by the industry. Referring to the first embodiment, the first advantages are obtained by the formation of etch stop layer 22 and passivation layer 20. These layers allow more process latitude in the formation of gate area 32 as well as the use of standard semiconductor lithographic and etch processes to form gate contact 40, thus eliminating the need for metal lift-off processing. The use of non-gold refractory metals for both ohmic contacts 52 and gate contact 40 eliminate reliability concerns due to metal run-away or inter-diffusion. Finally, the discovery and use of a highly doped cap layer 24 with a minimum thickness combined with the formation of ohmic contacts 52 that have a minimum dimension of gap 51 allow the use of non-gold refractory metals in the manner described.

We claim:

1. A heterostructure field effect transistor, comprising:

a semi-insulating wafer substrate;

a plurality of semiconductor layers overlying the semi-insulating wafer substrate in an order as follows, a buffer layer, a first supply layer, a channel layer, a second supply layer, a passivation layer, an etch stop layer and a heavily doped cap layer, wherein each semiconductor layer is comprised of group III–V compounds and the etch stop layer is comprised of aluminum arsenide;

ohmic contacts disposed on the heavily doped cap layer wherein the ohmic contacts comprise a non-gold refractory metal; and a gate contact area formed by etching portions of the heavily doped cap layer and the etch stop layer of the plurality of semiconductor layers, wherein an edge of the heavily doped cap layer which is adjacent to the gate contact and is spaced at least two micrometers from an edge of adjacent one of the ohmic contacts;

a gate contact formed within the gate contact area, wherein the gate contact comprises a refractory metal in direct contact with the passivation layer.

2. The heterostructure field effect transistor of claim 1 wherein the first supply layer is doped with silicon to a first concentration and the second supply layer is doped silicon to a second concentration.

3. The heterostructure field effect transistor of claim 1 wherein the refractory metal includes TiWN.

4. The heterostructure field effect transistor of claim 1 wherein the non-gold refractory metal includes NiGeW.

5. The heterostructure field effect transistor of claim 1 wherein the heavily doped cap layer is at least approximately 700 Å thick.

6. A heterostructure field effect transistor comprising:

a semi-insulating wafer substrate;

a plurality of semiconductor layers, comprised of group III-V compounds, overlying the semi-insulating wafer substrate, wherein the plurality of semiconductor layers are formed in an order as follows, a buffer layer, a first supply layer, a channel layer, a second supply layer, a first passivation layer, a first etch stop layer, a second passivation layer, a second etch stop layer, and a heavily doped cap layer;

first ohmic contact areas formed by removing portions of a dielectric layer;

a first gate contact area disposed between two first ohmic contact areas, wherein the first gate contact area is formed by removing portions of the heavily doped cap layer and the first etch stop layer;

second ohmic contact areas formed by removing portions of a dielectric layer;

a second gate contact area disposed between two second ohmic contact areas, wherein the second gate contact area is formed by removing portions of the heavily doped cap layer, the first etch stop layer, the first passivation layer, and the second etch stop layer;

a first gate contact disposed within the first gate contact area and a second gate contact disposed within the second gate contact area;

first ohmic contacts overlying the first ohmic contact areas wherein the first ohmic contacts are spaced at least 2μ from the edges of the heavily doped cap layer adjacent to the first gate electrode;

second ohmic contacts overlying the second ohmic contact areas wherein the second ohmic contacts are spaced at least 2μ from the edges of the heavily doped cap layer adjacent to the second gate electrode;

implant regions disposed essentially between the second gate contact and the second ohmic contacts wherein each implant region, overlaps the second gate contact area by at least approximately 0.5μ and does not overlap the second ohmic contacts; and a pattern of interconnect metal providing electrical contact to heterostructure field effect transistor elements.

7. The heterostructure field effect transistor of claim 6 wherein the first supply layer is doped with silicon to a first concentration and the second supply layer is doped with silicon to a second concentration.

8. The heterostructure field effect transistor of claim 6 wherein the semi-insulating wafer substrate is comprised of GaAs, the buffer layer is comprised of GaAs and/or GaAs/AlAs superlattice, the first supply layer and the second supply layer are comprised of AlGaAs, the channel layer is comprised of InGaAs, the first passivation layer and the second passivation layer are comprised of GaAs, the first etch stop layer and the second etch stop layer are comprised of AlAs and the heavily doped cap layer is comprised of GaAs.

9. The heterostructure field effect transistor of claim 6 wherein the heavily doped cap layer is at least approximately 700 Å thick.

10. The heterostructure field effect transistor of claim 6 wherein the semi-insulating wafer substrate is comprised of InP, the buffer layer is comprised of AlInAs, the first supply layer and the second supply layer are comprised of AlInAs, the channel layer is comprised of InGaAs, the first passivation layer and the second passivation layer are comprised of GaAs, the first etch stop layer and the second etch stop layer are comprised of AlAs or AlInAs and the heavily doped cap layer is comprised of InGaAs.

11. The heterostructure field effect transistor of claim 6 wherein the first gate contact and the second gate contact further comprises TiWN, and the first ohmic contacts and the second ohmic contacts further comprise NiGeW.

12. A heterostructure electronic device, comprising:

at least one gate contact area;

a gate contact formed in direct contact with a passivation layer within each of the at least one gate contact area; and at least two ohmic contacts, wherein the at least two ohmic contacts are located on a heavily doped cap layer which is at least approximately 700 Å thick and which is disposed on an etch stop layer of aluminum arsenide, and wherein the at least one gate contact area is positioned centrally between a pair of ohmic contacts wherein each of the pair of ohmic contacts is spaced at least 2μ from an edge of the heavily doped cap layer adjacent to the gate contact.

13. The heterostructure electronic device of claim 12 wherein the heavily doped cap layer further comprises GaAs or InGaAs.

14. The heterostructure electronic device of claim 12 wherein the electronic device is an enhancement mode device.

15. The heterostructure electronic device of claim 12 wherein the electronic device is a depletion mode device.

16. The heterostructure electronic device of claim 12 including at least one enhancement mode device and at least one depletion mode device.

* * * * *